United States Patent [19]

Balsells

[11] Patent Number: 5,117,066

[45] Date of Patent: * May 26, 1992

[54] RETAINING AND LOCKING ELECTROMAGNETIC GASKET

[75] Inventor: Peter J. Balsells, P.O. Box 15092, Santa Ana, Calif. 92705

[73] Assignees: Peter J. Balsells; Joan C. Balsells, both of Santa Ana, Calif.

[*] Notice: The portion of the term of this patent subsequent to Jun. 19, 2007 has been disclaimed.

[21] Appl. No.: 645,197

[22] Filed: Jan. 24, 1991

Related U.S. Application Data

[63] Continuation-in-part of Ser. No. 568,909, Aug. 17, 1990, which is a continuation-in-part of Ser. No. 444,287, Dec. 1, 1989, which is a continuation-in-part of Ser. No. 463,480, Jan. 11, 1990, abandoned, which is a continuation-in-part of Ser. No. 348,419, May 8, 1989, Pat. No. 4,974,821, which is a continuation-in-part of Ser. No. 186,017, Apr. 25, 1988, Pat. No. 4,830,344.

[51] Int. Cl.⁵ .................... H05K 9/00; B65D 53/00
[52] U.S. Cl. ..................... 174/35 GC; 174/35 R; 277/235 R; 277/901
[58] Field of Search .......... 174/35 GC, 35 R, 35 MS; 361/424; 277/227, 235 R, 235 B, 901; 219/10.55 D, 10.55 R; 267/167

[56] References Cited

U.S. PATENT DOCUMENTS

| | | | |
|---|---|---|---|
| 4,655,462 | 4/1987 | Balsells | 277/164 |
| 4,934,666 | 6/1990 | Balsells | 267/1.5 |

FOREIGN PATENT DOCUMENTS

0774419  5/1957  United Kingdom .......... 174/35 GC

*Primary Examiner*—Leo P. Picard
*Assistant Examiner*—Bot Ledynh
*Attorney, Agent, or Firm*—Walter A. Hackler

[57] ABSTRACT

An electromagnetic shielding spring gasket assembly includes a coil spring for blocking the propagation of electromagnetic waves therepast. The coil spring includes a plurality of coils having a major and a minor axis and canted along a center line defined by an intersection of the major and minor axes and may be interconnected in a manner forming a radial garter-type canted-coil spring. A back angle of each coil defines the disposition of a trailing portion of each coil with respect to a line normal to the center line which determines a radial load-deflection characteristic of the canted-coil spring assembly. A front angle of each coil defines the disposition of a leading portion of each coil with respect to the normal line. The plurality of coils are noninvasively supported in an orientation for controlling the blocking of electromagnetic waves, for radial loading of the radial garter-type canted-coil spring and for controlling the resilient characteristics of the radial garter-type canted-coil spring.

17 Claims, 9 Drawing Sheets

RETAINING AND LOCKING ELECTROMAGNETIC GASKET

The present application is a continuation-in-part of U.S. patent application Ser. No. 568,909 filed Aug. 17, 1990, which is a continuation-in-part of U.S. patent application Ser. No. 444,287 filed Dec. 1, 1989 and U.S. patent application Ser. No. 463,480 filed Jan. 11, 1990 now abandoned. U.S. Ser. Nos. 444,287 and 463,480 are to be totally incorporated, including drawings, into the present application by this specific reference thereto. The present application is also a continuation-in-part of U.S. patent application Ser. No. 463,480, filed Jan. 11, 1990 now abandoned, which is a continuation-in-part of U.S. patent application Ser. No. 348,419, filed May 8, 1989, now U.S. Pat. No. 4,974,821 which is a continuation-in-part of U.S. patent application Ser. No. 186,017, filed Apr. 25, 1988, now U.S. Pat. No. 4,830,344. U.S. Ser. Nos. 348,419 and 463,480 and U.S. Pat. No. 4,830,344 are to be totally incorporated, including drawings, in the present application by this specific reference thereto.

The present invention generally relates to canted-coil springs and seals and, more particularly, relates to canted-coil springs retained in a cavity with interference between the spring coils and the cavity to retain the spring in a selected orientation for subsequent loading of the spring. Orienting the spring for major or minor axis loading enables a specific selected resilient, or load-deflection, characteristic, in response to the subsequent loading of the springs.

Additionally, the present invention related to canted-coil springs retained in a groove with interference between the spring coils and the groove to retain the spring in a selected orientation for subsequent loading of the spring. Orienting the spring for major or minor axis loading enables a specific selected resilient, or load-deflection, characteristic, in response to the subsequent loading of the springs.

It should be appreciated that cavities as hereinafter discussed may be linear or continuous with a desired shape, be it circular or otherwise. For as in circular cavities, the spring may have end coils welded forming a garter-type canted-coil spring.

Of particular interest is a gasket for sealing electromagnetic waves between a shaft and a housing as a piston and a bore. In this instance, the gasket is loaded radially to prevent passage of electromagnetic waves past the shaft or bore.

It is generally well-known that electromagnetic transmission may be described by wave theory and further in terms of an electric field and a magnetic field which travel in a 90° phase relationship with one another in free space. Wave theory describes electromagnetic energy in terms of wavelength and amplitude.

It should be appreciated that electromagnetic energy is used here as a generic term including the full spectrum of electromagnetic energy frequencies. Generally speaking, electromagnetic interference (EMI) and radio frequency interference (RFI) are used to describe interference caused by unwanted electromagnetic energy or radio frequency energy entering or leaving a designated piece of equipment.

The ability to shield a component from egress or ingress of electromagnetic energy is often called shield effectiveness.

Microwave energy having frequencies from about 100 kHz to about 300 gHz is commonly referred to as microwaves. The microwave frequencies spectrum may be further divided into three general groups, which include commercial bands, 100 kHz to 10 gHz, military bands, 10 gHz to 50 gHz and millimeter bands 50 gHz to 300 gHz.

Shield effectiveness of any particular frequency range is significantly affected by any gaps or openings therein which will allow electromagnetic fields to radiate therethrough unless current continuity can be preserved across the opening. The importance of the opening is, of course, dependent upon the frequency of the impinging electromagnetic energy. it should be understood that the shielding effectiveness is a measure of the efficiency of an EMI gasket measured in decibels (dB), the higher the shielding effectiveness, the more effective a gasket is. Such shielding effectiveness is affected by the opening between coils, and "aperture" as herein used is defined as the maximum linear dimension (not area) of this opening. The greater the size of the aperture, the lower the shielding effectiveness. The aperture is the maximum linear dimension of a shield opening. Therefore, in a gasket, it is desirable to have the smallest aperture possible to achieve maximum shielding effectiveness.

Two general types of spring gaskets disclosed in the present invention include one having spacing between coils when loaded and another having coils butted at load. The butted coils provide the smallest aperture and thus the maximum shielding effectiveness.

The length of the aperture in a spring gasket, as hereinafter disclosed, is affected by the wire diameter, the D/d ratio and the spacing between coils.

As a general rule, for effective shielding in commercial use, the opening size should be less than the wavelength of the electromagnetic energy divided by 20. For military bands the opening size should be less than the wavelength divided by 50, and for the millimeter bands the opening should be less than the wavelength divided by 200. Because of the dependence on the wavelength, the effectiveness of any gasket may be determined at a particular frequency the size of the openings or apertures therein.

Heretofore available gaskets have been unable to provide dimensional stability throughout the life of equipment in order to prevent the formation of unwanted gaps therein which may be unacceptable in terms of shield effectiveness. This is especially true when the gaskets are utilized in situations where repeated disassembly and assembly are needed with the gasket relied on to prevent EMI or RFI between components requiring such assembly.

The gasket of the present invention, however, provides an effective electromagnetic shield through the use of a plurality of conductive wire coils and means for loading the plurality of coils in a manner so that the coil spacing may be adjusted in selected areas along the circumference thereof in order to provide an electromagnetic shield. In addition, the gasket of the present invention provides sufficient biasing capability to make up for variations that may occur due to torquing, eccentricities, irregularities and other variables, and maintain intimate contact between mating surfaces under load. Further, the structure of the present invention enables the retaining and locking of an axial spring gasket in a radial cavity.

Regarding the mechanical characteristics of garter-type springs incorporated by the present invention, it is well-known that the force-deflection characteristics of heretofore available garter-type axially loaded springs have been varied by changing numerous spring parameters, including the wire size, the coil height, the coil spacing, and the front angle, which defines a leading portion of each canted spring coil. While these parameters can be used effectively to tailor the load-deflection characteristics of the spring, they do not either dominate or enable the spring to achieve its total design potential. This was taught in U.S. Pat. Nos. 4,826,144 and 4,915,366 to Balsells.

These references disclose coils which are interconnected in a manner forming a garter-type resilient coil spring, with the trailing portion along an outside diameter of the garter-type axially resilient coil spring and the leading portion along an inside diameter of the garter-type axially resilient coil spring and vice versa.

The selected disposition of the back angle and trailing portions defined thereby provides for the capability of tailoring a garter-type axially resilient coil spring beyond the range of conventional garter-type resilient coil springs heretofore known.

As a consequence, springs may be formulated with higher load-deflection characteristics. That is, the spring is able to exert a greater force in response to a given deflection than a spring having the same dimensions and wire size with a trailing portion along the inside diameter of the spring.

As a result, these springs can be fabricated from smaller wire and have a closer coil spacing, while still exerting the same force in response to deflection as prior art springs.

The present invention is related to the discovery of other parameters which can be utilized to design garter-type springs having selected load-deflection characteristics, particularly when radially loaded.

First, it has been found that the turn angle, as hereinafter defined and discussed, can be utilized in the fabrication of garter-type radially loaded springs having higher load-deflection characteristics than heretofore fabricated springs utilizing the same wire diameters. The advantages of higher loading have been hereinabove discussed.

In addition, the specific relationship and working resilient range of springs made in accordance with the present invention, can also be used to advantage and provide springs with tailored load-deflection characteristics which were not heretofore possible.

Second, it has been found that radial loading of the garter-type springs along the major axis thereof, as hereinafter discussed, with or without variation of the turn angle provides additional means for tailoring the load-deflection characteristics of the spring and causing such spring to cant along the major axis thereof radially from the inside or radially from the outside under an applied radial force.

It should be appreciated that in order for the spring to cant upon major axis radial loading, it needs to be contained in a cavity, or groove. It has been found that when the spring is in a free position and loaded along the major axis in a radial direction, it will resist canting or not cant at all.

In addition, the spring may be mounted, or contained, in a position wherein it will cant radially along the major axis and radially along the minor axis under application of both a radial and axial force.

SUMMARY OF THE INVENTION

In accordance with the present invention, an electromagnetic shielding spring gasket assembly includes a coil spring means for blocking the propagation of electromagnetic waves therepast, said coil spring means including a plurality of individual coils having a major and a minor axis and canted along a center line thereof defined by an intersection of the major and minor axes. The coils are interconnected in a manner forming a radial garter-type canted-coil spring and back angle means is provided for both defining the disposition of a trailing portion of each coil with respect to a line normal to the center line and for determining a radial load-deflection characteristic of the canted-coil spring assembly.

Front angle means are provided for defining the disposition of a leading portion of each coil with respect to the normal line, said front angle means being greater than said back angle means and additionally provided is means for noninvasively supporting the plurality of coils in an orientation for controlling the blocking of electromagnetic waves, for radial loading of the radial garter-type canted-coil spring and for controlling the resilient characteristics of the radial garter-type canted-coil spring.

Also provided are means, cooperating with said means for supporting the plurality of coils for loading the plurality of coils to control an aperture of the coil spring means through which electromagnetic waves can propagate.

In one embodiment of the present invention, a wedge is included which provides means for causing said individual coils to abut one another.

In a preferred embodiment of the present invention, the back angle means defines a working resilient range wherein the gasket exhibits a generally constant force in response to deflection of the gasket. In this manner, minor variations, tolerances, eccentricities or variations due to temperature and environmental conditions which may generally affect the spacing between mating parts do not affect the loading or sealing force therebetween provided by the gasket. This distinguishes the gasket of the present invention heretofore available as an electromagnetic shielding gasket.

Means, orienting the plurality of coils at a turn angle may be provided for controlling the magnitude of the generally constant force within the selected range of deflection.

The coils may be interconnected in a manner such that the trailing portion is along an inside diameter of the gasket and the leading portion is along an outside diameter of the gasket, or the trailing portion may be disposed along an outside diameter of the gasket and the leading portion along an inside diameter of the gasket.

In another embodiment of the present invention, the means for loading or preloadng the plurality of coils may be by means defining a groove for holding the plurality of coils and wedge means for deflecting the plurality of coils along a minor axis thereof. The wedge means may be suspended in the groove means and biased by the plurality of coils against an opposing loading surface, or the wedge means may be fixed to an opposing loading surface and the wedge may be fixed in the groove.

In this circular configuration, the seal-load portion of each coil collectively defines a load circle and the wedge means is operative for compressing the circular axially resilient gasket along the minor axis thereof for reducing the load circle.

The coils may be interconnected to provide for either an axially resilient electromagnetic shielding gasket or a radially resilient electromagnetic shielding gasket.

In another embodiment of the present invention, the butting of the spring coils at load, compared to a spring with spacing between coils, results in a smaller aperture and higher shielding effectiveness.

More specifically, the means for noninvasively supporting the plurality of coils may include means, defining a radial groove, for supporting and orienting said radial garter-type canted-coil spring with a turn angle of greater than zero degrees (0°) and less than ninety degrees (90°).

In addition, the electromagnetic shielding gasket assembly may include individual coils fabricated from wire having a diameter, d, selected to achieve a desired shielding effectiveness. In this case, the shielding effectiveness dereases with increasing wire diameter. The individual coils may be formed with a coil diameter, D, selected to achieve a desired shielding effectiveness, and in this instance the effectiveness increases with increasing D/d ratio.

BRIEF DESCRIPTION OF THE DRAWINGS

The advantages and features of the present invention will appear from the following description and considered in conjunction with the accompanying drawings in which.

DETAILED DESCRIPTION

A resilient electromagnetic shielding gasket in accordance with the present invention may be described, in part, by its load-deflection characteristics.

Depending on its application, a number of load-deflection characteristics may be utilized; however, of particular use is a gasket which exerts a generally constant force in response to deflection of the gasket. This feature enables the gasket, in accordance with the present invention, to accommodate variations in mating surfaces between which electromagnetic shielding is to be provided. Such variations may be due to surface irregularities, tolerances, or temperature and pressure effects. The shielding gasket provides a stable, long-lived gasket capable of shielding against electromagnetic radiation in a consistent manner over time, despite temperature and pressure effects, and/or continued assembly and disassembly of mating parts.

Figure 1:
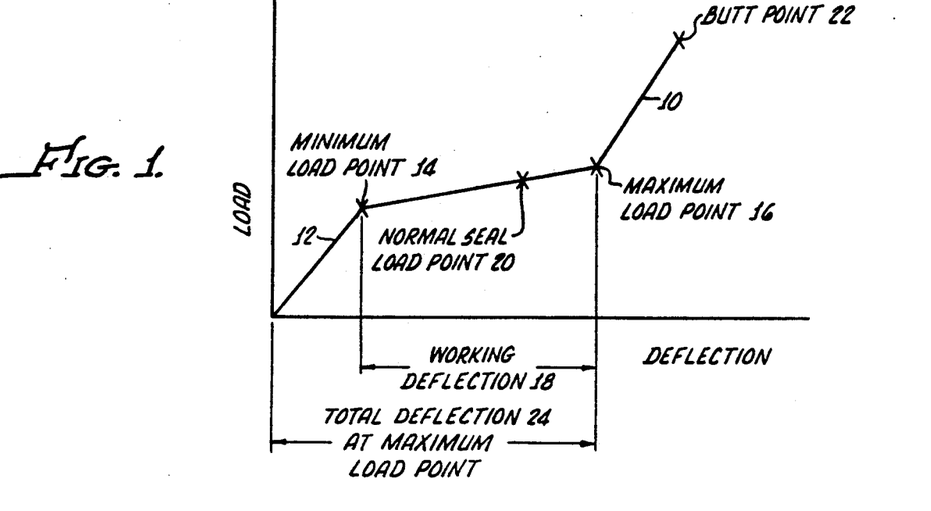
FIG. 1 is a theoretical load vs. a deflection curve illustrating the various parameters of a electromagnetic shielding gasket in accordance with the present invention.

For the purposes of describing a desirable load-deflection characteristic, an exemplary load-deflection curve 10 is shown in FIG. 1. As can be seen when a load is applied to the gasket, it deflects in a generally linear fashion as represented by the line segment 12 until it reaches a minimum load point 14 which represents the point at which, after the initial deflection, the load begins deflection, the load begins to remain relatively constant.

It should be appreciated that for an axially resilient gasket, hereinafter described, the load is applied axially and for a radially resilient gasket, hereinafter described, the load is applied radially.

Between the minimum load point 14 and a maximum load point 16, the load-deflection curve may be constant or show a slight increase as shown in FIG. 1. The area between the minimum load point 14 and the maximum working deflection range 18.

The gasket is normally loaded for operation within this range, as indicated by the point 20, for a typical gasket in accordance with the present invention, for electromagnetic shielding purposes. In addition, the gasket also may provide sealaing between the mating surfaces.

Loading of the gasket beyond the maximum load point 16 results in an abrupt deflection response until it reaches a butt point 22, which may result in a permanent set in the gasket as a result of overloading. Also indicated in FIG. 1 is the total deflection range 24, which is defined as the deflection between the unloaded gasket and the deflection of the maximum working load point 16.

A gasket, as hereinafter identified, in accordance with the present invention, may assume many forms. For example, it may be linear, have any irregular shape, or be interconnected to form a round, elliptical or other continuous shape, as hereinafter discussed.

Figure 2:
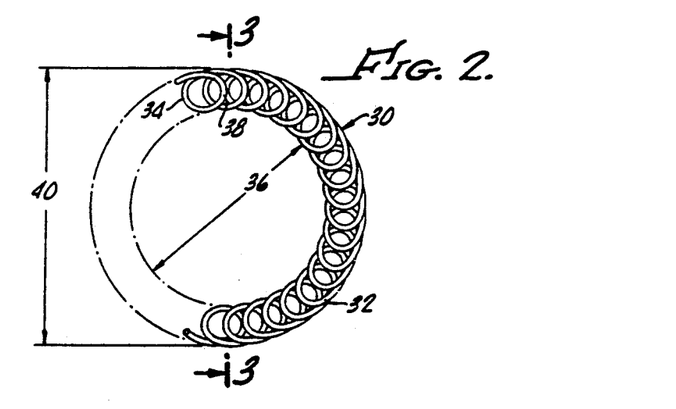
FIG. 2 is a plan view of an electromagnetic shielding gasket in accordance with the present invention in which coils are interconnected in a manner forming an axially resilient coil gasket with a trailing portion having a back angle along an inside diameter of the gasket and a leading portion having a front angle along an outside diameter of the gasket, the coils being interconnected to produce a clockwise canting of the coils (the coils also may be interconnected to produce a counter-clockwise canting, see FIG. 4)
Figure 3:
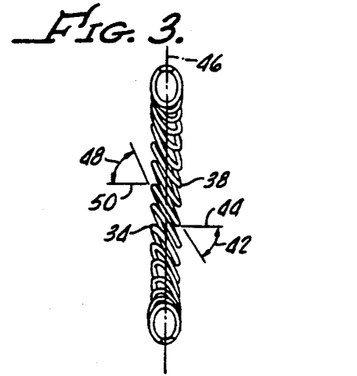
FIG. 3 is a cross-sectional view of the gasket shown in FIG. 2 taken along a line 3—3 and showing the relative position of the back angle and the front angle of the spring.

First, an axially resilient electromagnetic shield, or gasket, 30 as shown in FIG. 2, may have a plurality of coils 32 interconnected in a manner such that a trailing portion 34, see FIG. 3, is along an inside diameter 36 of the gasket 30 and a leading portion 38 is along an outside diameter 40 of the gasket 30. FIG. 2 shows the gasket 30 interconnected and wound with a clockwise canting of coils. An alternative embodiment (not shown) may be made as described in FIGS. 2 and 3 but having the coils instead canting in a counterclockwise and wound in a counterclockwise direction as shown in FIG. 4.

From FIG. 3, it can be seen that the back angle 42 provides means for defining the disposition of the trailing portion 34 of each coil with respect to a line 44 normal to the centerline 46 and a front angle 48 provides means for defining the disposition of the leading portion 38 of each coil with respect to a normal line 50. The back angle 42 additionally determines the working resilient range of the gasket as disclosed in U.S. Pat. Nos. 4,826,144 and 4,915,366. Specific details of the use of the back angle to determine the gasket resilient range are disclosed within these references, which are incorporated herewith by specific reference thereto, and not discussed in detail herein as they disclosed in the cited references.

Figure 4:
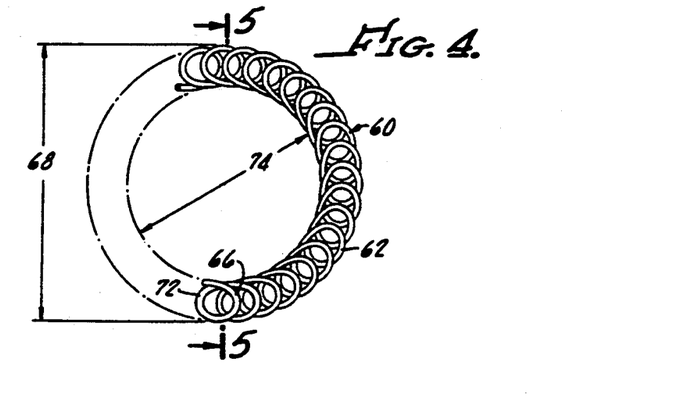
FIG. 4 is a plan view of an electromagnetic shielding gasket in accordance with the present invention in which the coils are interconnected to define an axially resilient electromagnetic shielding gasket with a trailing portion having a back angle along an outside diameter of the gasket and a leading portion having front angle along an inside diameter of the gasket, the coils being interconnected to produce a counter-clockwise canting of the coils (the coils also may be interconnected to produce a clockwise canting, see FIG. 2)
Figure 5:
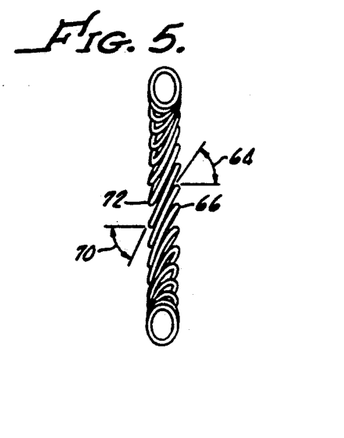
FIG. 5 is a cross-sectional view of the electromagnetic gasket of FIG. 4 taken along the line 5—5 and showing the relative positions of the front and the back angle.

Turning now to FIGS. 4 and 5, there is shown an axially resilient circular gasket 60 having a plurality of coils 62 interconnected in a fashion providing a counterclockwise canting of coils and as shown in FIG. 5, having a back angle 64 defining a trailing portion 66 along an outside diameter 68 and a front angle 70 defining a leading portion 72 along the inside diameter 74 of the gasket 60.

FIG. 4 shows the gasket 60 interconnected and wound with a counterclockwise canting of coils. An alternative embodiment (not shown) may be made as described in FIGS. 4 and 5 but having the direction of canting in a clockwise direction (see FIG. 2). In addition, the direction of winding may be reversed.

Figures 6, 7, 8, 8A:
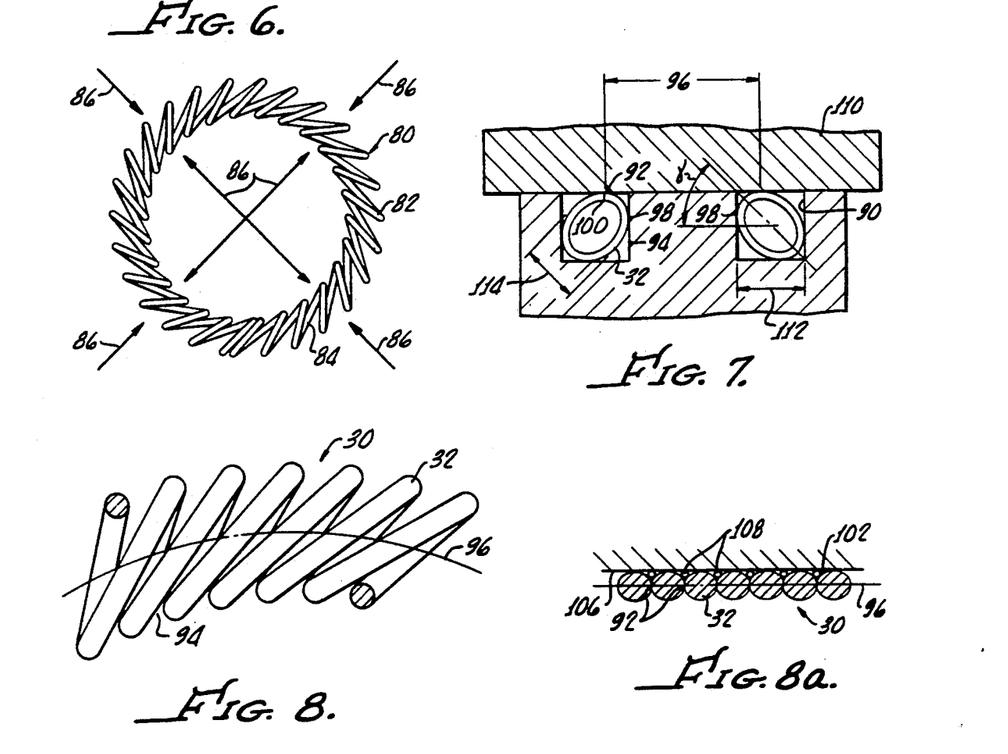
FIG. 6 is an electromagnetic gasket in accordance with the present invention in which the coils are interconnected to form a radially resilient electromagnetic gasket.
FIG. 7 shows an axially resilient electromagnetic gasket disposed in a cone position and having a load turn angle which may vary, but is shown therein at about 45°.
FIG. 8 is a perspective view of the axially resilient electromagnetic gasket of FIG. 7 taken along a load line and showing a load line, or circle, at which a portion of each coil in the electromagnetic gasket has a spacing between coils.
FIG. 8a shows, in cross section, an alternative embodiment in which the coils may abutt upon preloading or loading thereof.

As shown in FIG. 6, another embodiment of the present invention, an electromagnetic gasket 80 may include a plurality of conductive coils 82 canted along a centerline 84 thereof and interconnected in a manner forming a circular radially resistant gasket. Loading of the gasket 80 occurs in a radial manner as indicated by the load arrows 86.

Turning now to FIG. 7, there is shown in a diagrammatic cross-sectional manner the axially resilient gasket 30 disposed in a groove 90, which provides means for preloading the plurality of coils 32 in a manner causing coil spacing along the circumference of the inside diameter of the spring as loaded to be less along the inside diameter 98 and such spacing to increase progressively at seal-load 92 of each coil 32 and increase further towards the O.D. of the spring.

The coil spacing along these seal-load portions 92 is selected to limit the passage of electromagnetic energy with a wave length greater than a selected value.

To more clearly show the relationship of the seal-load portion 92, a diagrammatic perspective view taken along a load circle 96 is shown in FIG. 8. The load line/circle 96 being collectively defined by the seal-load portions 92 of the coils 32.

FIG. 8 shows the gasket 30 in a loaded position with spacing between coils.

As shown in FIG. 7, load sealing points 100 are coincident with the load circle 96 when the gasket 30 is disposed in the groove 90 at a load turn angle $\gamma$ which may be from about 1 degrees to 90 degrees, and preferably 45 degrees. The gasket 30 is shown in a "cone" configuration and as such develops a small load circle which is disposed proximate the gasket inside diameter 36. (See FIG. 2). After assembly of the gasket 30 into the groove 90, it is generally loaded by a flange 110.

The best shielding effectiveness with the spring described in FIGS. 7 and 8 is achieved when the aperture is at a minimum which occurs when the wire diameter is at maximum, the D/d ratio is at a minimum and the spacing between coils is at maximum.

The groove width 112 may be either smaller, equal to or larger than the coil height 114. However, it is preferable that the groove width is greater than the coil height as there is less possibility of spring damage upon loading the spring.

Figures 35, 36, 37, 38:
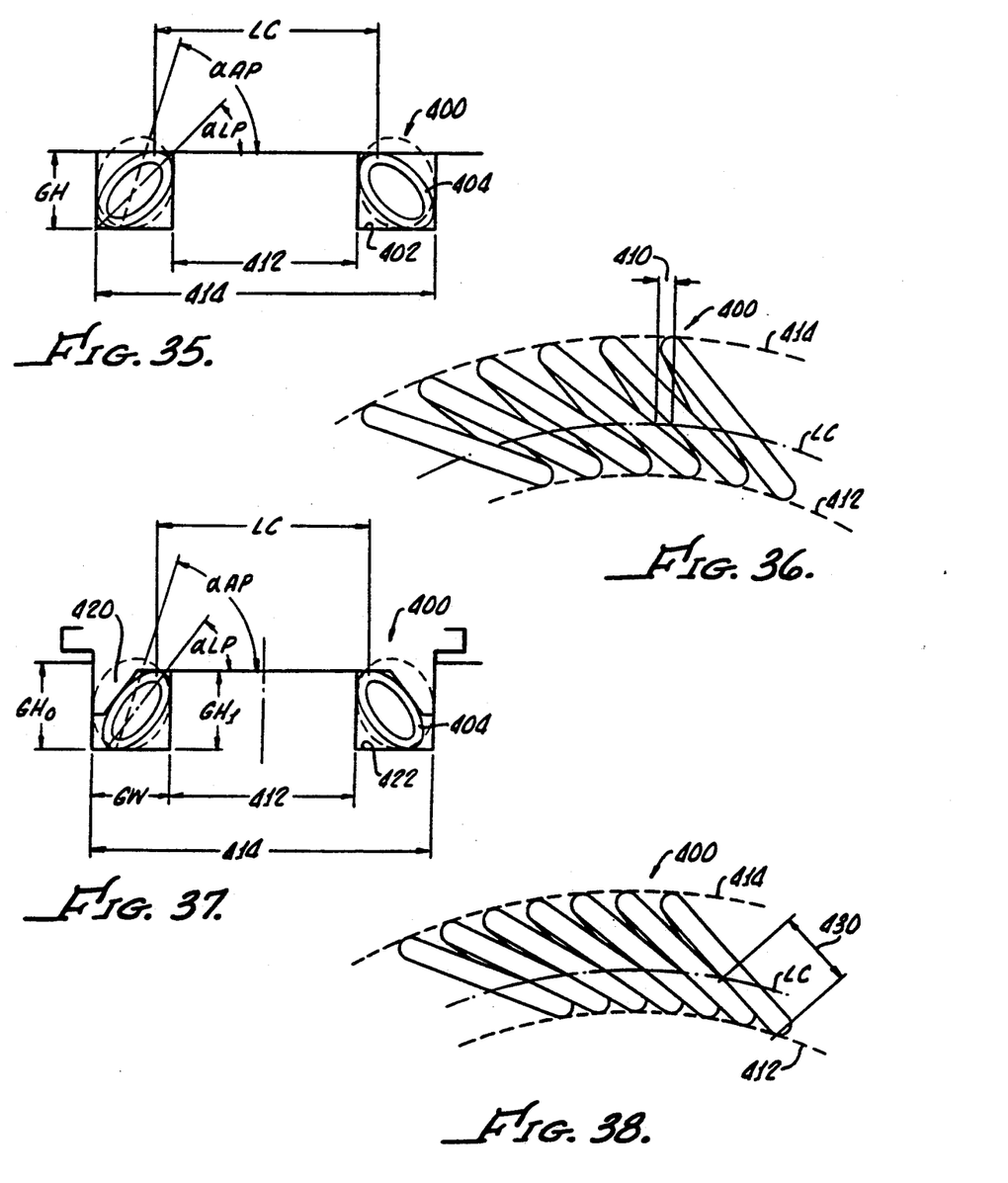
FIGS. 35 and 36 show an axial spring gasket deflected to safety load with spacing between coils at load.
FIGS. 37 and 38 show the spring gasket of FIG. 36 loaded with a wedge with coils butting a load circle.

In the configuration shown in FIG. 7, the gasket 30 will have a force-deflection characteristic which generally provides a force versus deflection where the force remains generally constant within the working deflection. However, if the assembly turn angle, see FIG. 35, is greater than 70 degrees, there will be a tendency for snapping of the spring, which can occur when the groove width is equal or smaller than the coil height, specially when the spring back angle is at the O.D. which causes the force versus deflection curve to rise rapidly above the constant force and this is an indication that the fatiguing of the gasket may occur.

FIG. 8a shows a cross-section of the gasket 30 which is loaded with coils 32 abutting which shows a minimum area 102 subtended by the surface of adjoining and abutting coils 32 and a load surface 106. A conductive wire 108 may be disposed between abutting coils 32 in the area 102 for providing insert means to further limit the passage of electromagnetic therepast, or between the abutting coils 32. The conductive insert wire 108 may have a circular or V shape cross-section in order to more fully occupy the area 102.

Figures 9, 10, 11:
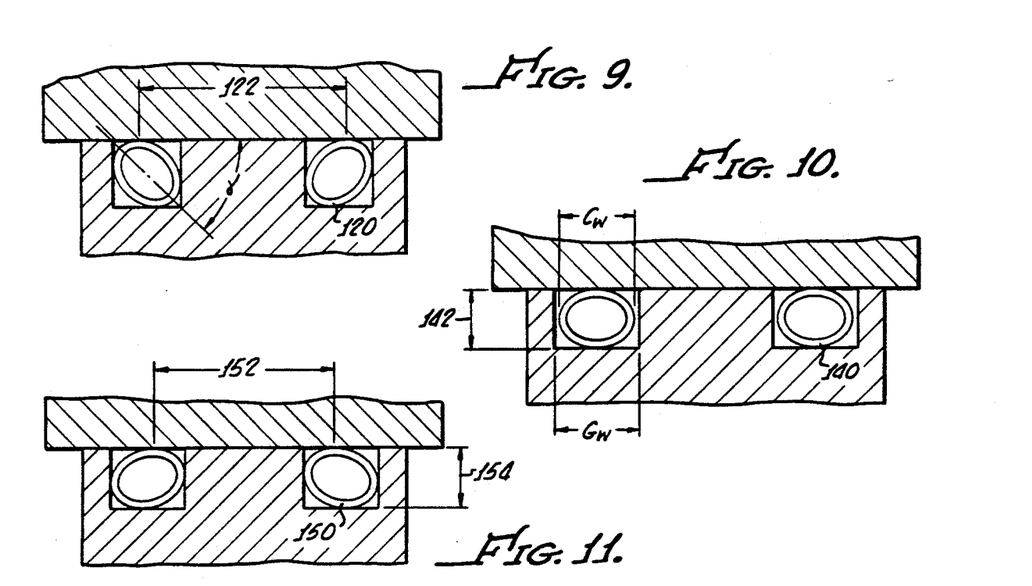
FIG. 9 is an axially resilient electromagnetic gasket shown in a loaded position and in an inverted cone position in which the load turn angle may vary, but is shown therein at about 45°.
FIG. 10 is an axially resilient electromagnetic gasket loaded along the minor axis thereof with a spring load turn angle of about 0 degrees.
FIGS. 11 is an axially resilient electromagnetic gasket loaded along the minor axis thereof, forming a cone, the load turn angle may be from 0 degrees to about 30 degrees. As shown, it is about 15 degrees.

Turning now to FIG. 9, there is shown an alternative embodiment of the present invention in which an axially resilient gasket 120 is shown in a loading position having a load turn angle which may be between 1 degree and 90 degrees, a preferred load turn angle of 45 degrees being shown. The gasket assumes an inverted cone shape and the position of the gasket is similar to the axial cone gasket except that upon assembly the gasket into the cavity, it is in an inverted position which is 180 degrees from the cone position.

The load circle 122 is substantially larger than in the axial cone type spring 30 and that allows greater open spacing between the coils occurring at the load circle 122. The force vs. deflection characteristics of this type gasket is as shown in FIG. 1, with an initial higher peak above the constant force when the assembly turn angle $\gamma$ (see FIG. 35) is greater than 70 degrees and the spring back angle is at the O.D. instead of the I.D.

Shown in FIG. 10 is an axially resilient gasket 140 as shown loaded along a minor axis 142 thereof. In this instance, the groove width $G_W$ is greater than the coil width $C_W$.

Another positioning of an axially resilient cone gasket 150 is shown in FIG. 11 in which the axial turn angle is between 0 and about 30 degrees and the load along the load circle 152 is along a minor axis 154 of the gasket 150. More detailed description of a coil preloading and loading within the groove will be hereinafter discussed in greater detail.

Figure 12:
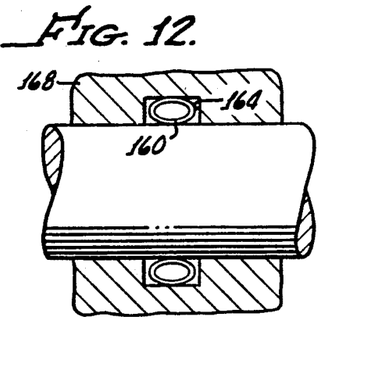
FIG. 12 is a radially resilient electromagnetic gasket disposed in a housing groove.
Figure 13:
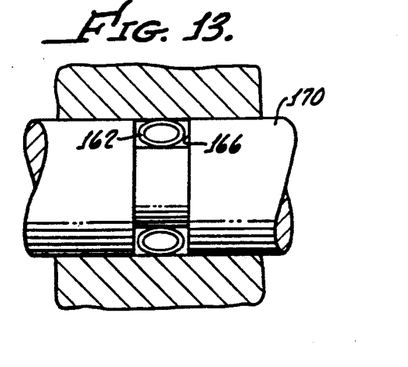
FIG. 13 is a radially resilient electromagnetic gasket disposed in a shaft groove.

Shown in FIGS. 12 and 13 are radial resilient gaskets 160, 162, respectively, in accordance with the present invention, shown within grooves 164 and 166, formed in a housing 168 and a shaft 170, respectively.

The hereinafter discussed parameter regarding the positioning of the springs 160 and 162 within the grooves 164, 166, respectively, are similar to the groove spring relationship, as hereinafter discussed in connection with the axially or radially resilient gaskets 30, 120, 140 and 150.

Figure 12A:
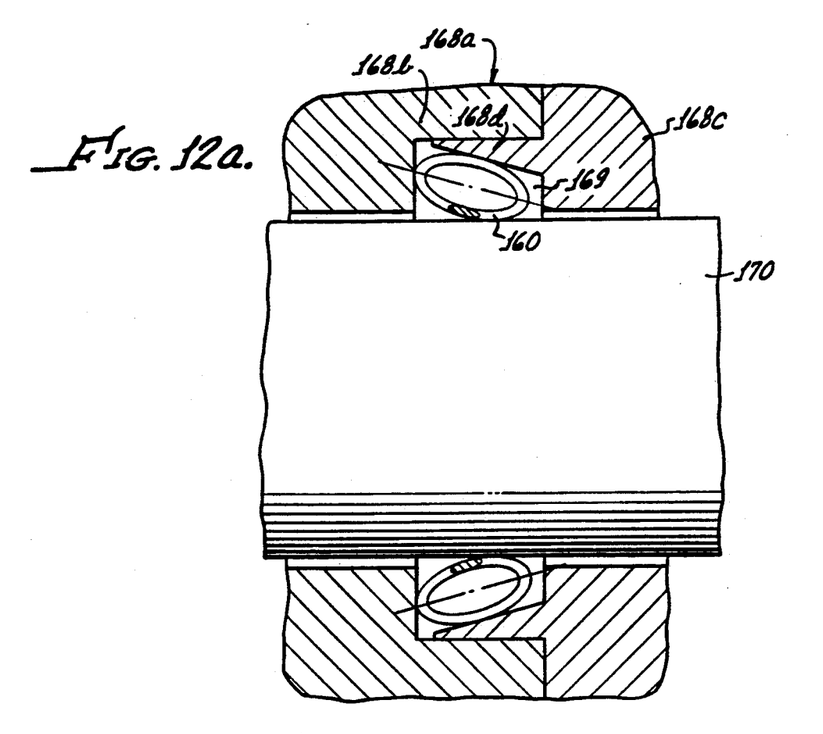
FIG. 12a is an electromagnetic shielding gasket assembled into housing grooves with a wedge providing means for loading the coils from the outside diameter towards the inside diameter causing the coils to butt towards the inside diameter.

FIG. 12a shows the spring 160 disposed in a housing 168a having two portions 168b, 168c with a wedge 168d for defining a cavity 169 between the housing 168a and shaft 170. When assembled, the wedge 168d loads the cavity 160 in a manner causing the spring 160 to progressively abut at the inside diameter.

Figure 13A:
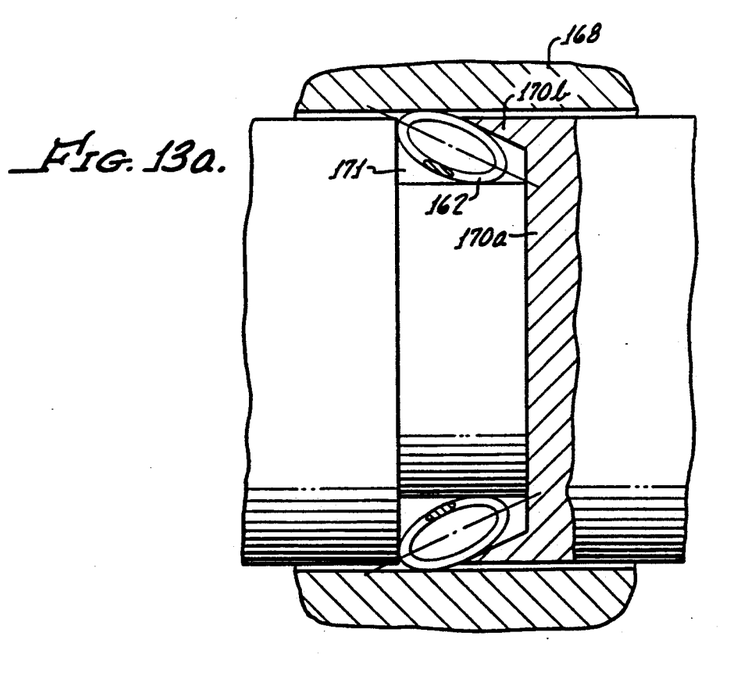
FIG. 13a is an electromagnetic shielding gasket assembled in a piston groove with a wedge providing means for loading the coils in a manner causing the coils to deflect at the outside diameter and butt towards the inside diameter.
Figure 31:
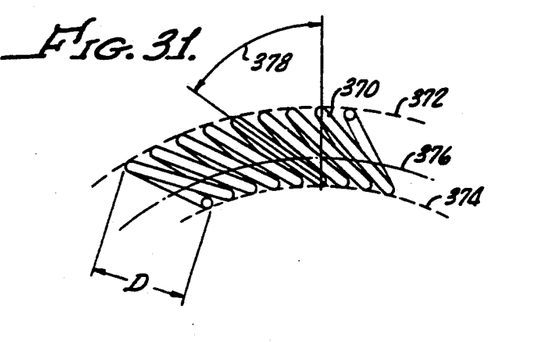
FIG. 31 shows the coil of FIG. 30 in a loaded state with the individual coils abutting one another, the wedge causing such butting not shown.

FIG. 13a shows the spring 162 disposed in a piston 170a having a wedge portion 170b defining a cavity 171 which loads the spring in a manner shown in FIG. 31 causing the spring 162 to deflect and progressively abut from the inside diameter.

Figure 14:
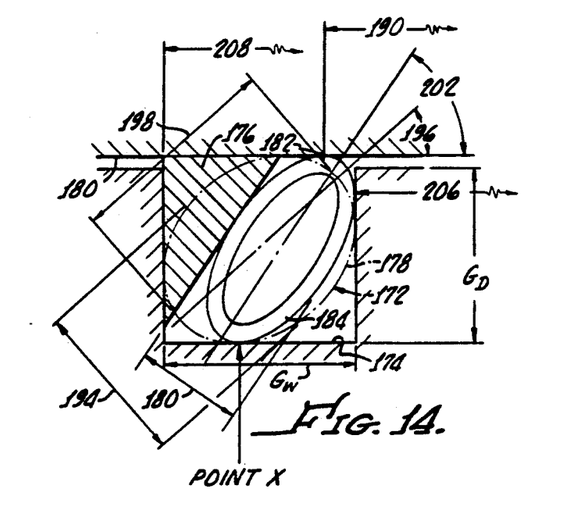
FIG. 14 is a diagram of an axially resilient electromagnetic gasket showing the loading thereof and showing a wedge for deflecting the gasket along the minor axis thereof, to a butt angle position.

FIG. 14 shows an enlarged view of an axially resilient electromagnetic shielding gasket 172 within a groove, or cavity, 174 and further including a wedge 176 which may be suspended in the groove 174 and biased by the plurality of coils 178 against an opposing loading surface 180 in order to cause coil spacing along the circumference of adjoining coils to be less along the I.D. of the spring gasket at 206 when in a loaded position than along other coiled portions 184 184 along the circumference thereof. At a load circle 190 the spacing between coils when loaded will be slightly greater than at circumference 206 and such spacing between coils progressively increases from the I.D. of the spring circumference when loaded.

An important feature of the wedge 176 is the enablement of the coils 178 to abut without causing fatigue, or permanet set thereof which deflects the coils 178 from a coil height 194 to 180 and also causes the rotation of coils 178 within the groove 174 and thereby increases the shielding effectiveness of the gasket 172. The wedge prevents fatigue by rotation of the coils 178 in a manner increasing the assembly turn angle $\theta$ 196 to load turn angle $\gamma$ 202 thereof as herein described.

With proper selection of coil grooved and wedge dimensions, the coil can be made to abut along the load circle, yet be in a spaced-apart relationship along other portions 184 of the circumference. Wedge 176 is shown as a separate part; however, it can also be made as an integral part of the loading surface 180.

The separate wedge has the significant advantage that it can accommodate itself to the cavity 174 and may provide substantially better shielding effectiveness than a built-in wedge, shown in FIGS. 12a and 13a, in cases where the wedge 176 is sufficiently flexible to be able to be deflected by the spring gasket 172.

On the other hand, the built-in wedge has the significant advantage that the wedge and the loading means are in one unit, thus making it easier to fabricate, assemble and load.

As shown in FIG. 14, the groove width $G_W$ may be equal to the groove depth $G_D$ and, for example, these dimensions may be in the order of 0.15 inches. The gasket 172 may have a coil height 194 at assembly turn angle 196 of approximately 45 degrees and a coil width 198 of approximately 0.168 inches and form from wire having approximately 0.16 inch diameter.

As the gasket 172 is loaded within the groove 174 by the wedge 176, rotation of the spring occurs from the 45-degree load angle 196 to a butt turn angle 202, the load circle 190 being shown at the butt point. It can be seen that the coil height 194 decreases as the spring turns, decreasing the load circle and therefore reducing the open spaces considerably. As the spring 172 is deflected, the coils 178 begin to butt at the minimum inside diameter 206. As loading then occurs along the load circle, the coils will progressively butt towards the butt point 182.

As shown in FIG. 8a, showing abutting coils, minimum spacing occurs between the coils when they butt. In this case, the maximum dimension of the exposed space 102 is equal to the wire diameter.

Figure 15:
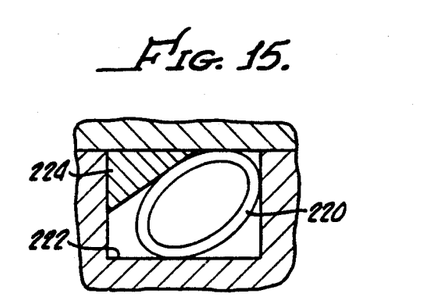
FIG. 15 is an alternative embodiment of the present invention.

An alternative embodiment of the present invention is shown in FIG. 15 in which a gasket 220 is disposed in a groove 222 and biased by a wedge 224 having a greater width than height. Wedge 224 can also be made as an integral part of the load surface as hereinabove described. Utilizing wedges 224 of different configurations, as for example shown in FIG. 15, the rate of butting of the coil 220 from the inside diameter towards the outside diameter as hereinabove described in connection with the gasket 172 may be varied. This enables load-deflection characteristics to be achieved with various groove widths $G_W$ and groove depths $G_D$.

It is important that along the load circle the coils either approach a butting relationship or remain in a butting relationship within the specific tolerances of the gasket and the groove dimensions. The fact that the coils butt from the inside diameter towards the outside diameter allows for a variation and tolerances of the groove and the gasket so as to avoid a complete butting of the coils which would damage the spring.

Figure 16:
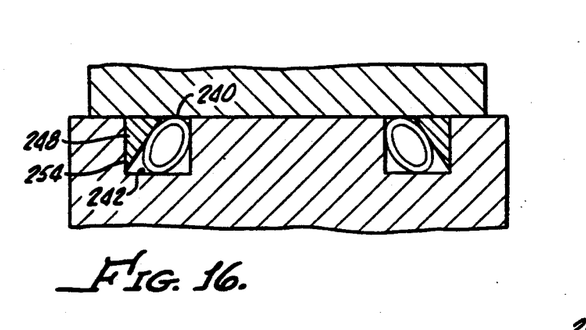
FIGS. 16, 17 and 18 are alternative embodiments of the present invention utilizing different shaped wedges and grooves.
Figure 17:
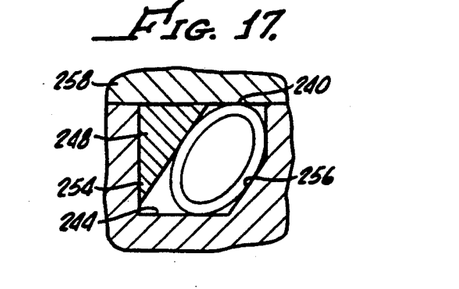
Figure 18:
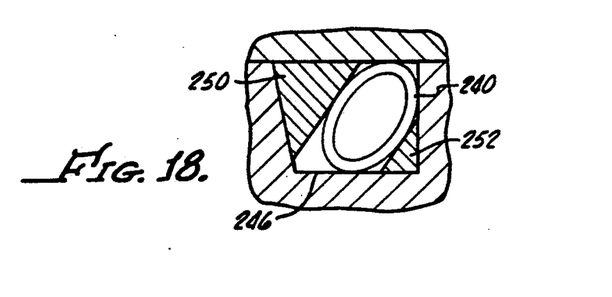

FIGS. 16, 17 and 18 show an axially resilient gasket 240 in combination with grooves 242, 244 and 246 and wedges 248, 250, 252, respectively. As hereinabove described, the wedges 248, 250, 252 may be an integral part of the loading surface. These alternative embodiments show the wedge 248 having a leg portion, 254 which can be used to modify the groove width.

Alternatively, as shown in FIG. 17, the groove 244 may have a tapered portion 256 for additionally compressing the spring 240 along the minor axis 258 thereof. Yet another embodiment is shown in FIG. 18 wherein the wedge 250 has a V shape and cooperates with wedge 252 for biasing the spring 240.

Figure 19:
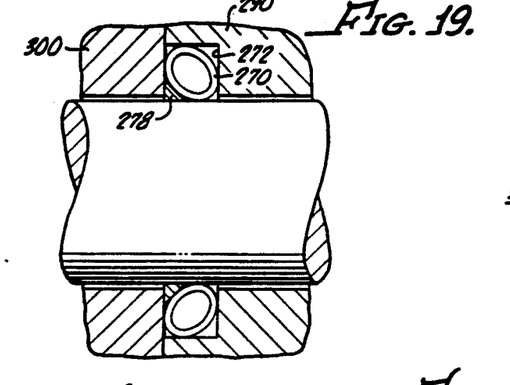
FIGS. 19, 20 and 21 are alternative embodiments of the present invention showing a wedge in position for compressing radially resilient electromagnetic gasket.
Figure 20:
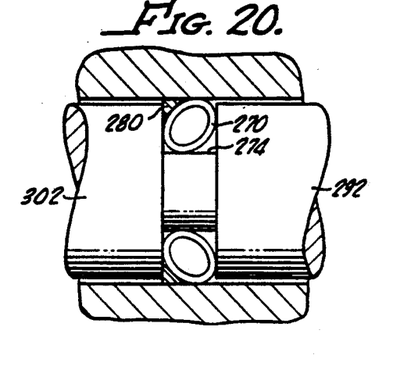
Figure 21:
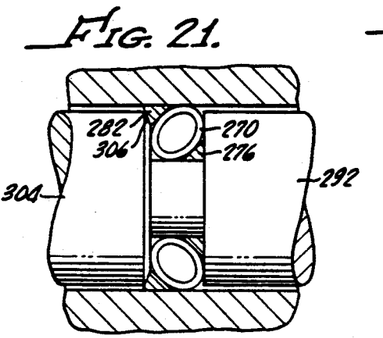

FIGS. 19, 20 and 21 show a radially resilient gasket 270 as it may be disposed in grooves 272, 274 and 276, respectively, along with loading by wedges 278, 280, 282. The gasket 270 may be housing 290 mounted or piston 292 mounted. Further, the groove 272, 274, 276 may be disposed in a single housing or a piston, not shown, or alternatively, may be formed in conjunction with a mating member 300, 302, 304, respectively. Similar to the mounting of the axially resilient gasket 240 a wedge shaped gasket 282 may be utilized when a beveled edge 306 incorporated into the mating member 304.

Figure 22:
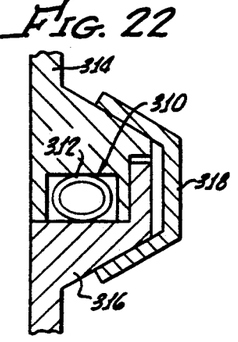
FIG. 22 shows a typical application of an embodiment of the present invention.
Figure 23:
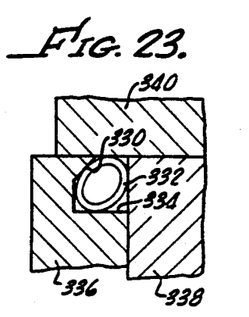
FIG. 23 shows an alternative embodiment of the present invention in which the groove is defined by mating portions thereby preloading the spring before loading thereof by a third mating member.

All of the embodiment shown in FIG. 16–21 as well as those shown in FIGS. 22 and 23 are only diagrammatically shown and briefly discussed since the principles of operation were more thoroughly discussed in connection with the gaskets 30 and 170.

For example, FIG. 22 shows a gasket 310 disposed in a groove 312 formed by mating portions 314, 316 which are held in position for biasing by the gasket 110 and by a clip member 318. FIG. 23 shows a built-in wedge 330 for biasing the gasket 332 within a groove 334 formed by right and left hand members 336, 338, with the gasket 332 being loaded by a flange 340.

Figure 24:
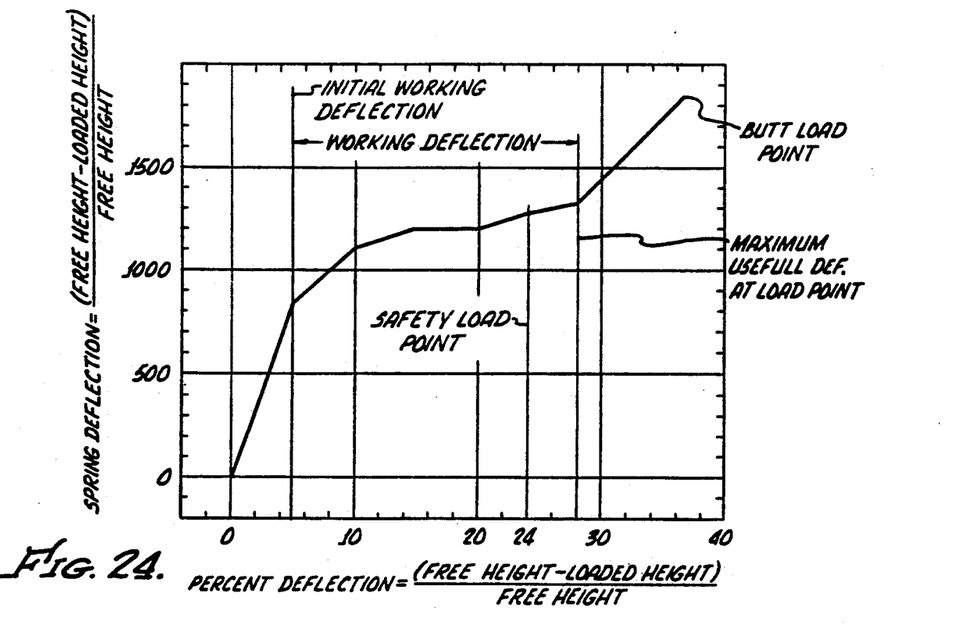
FIG. 24 is an axial or radial load deflection curve for a typical axially resilient electromagnetic coil spring in accordance with the present invention.

FIG. 24 shows a specific load-deflection curve for a gasket made in accordance with the present invention having the dimensions set forth in the description of FIG. 14. In this instance the spring is made from wire having a circular cross-section with a diameter of 0.022 inches, a coil height of about 0.16 inches, a back angle of between about 13 and about 15 degrees, a front angle between 29 and 31 degrees and coil spacing of between about 0.19 inches and 0.17 inches.

Figure 25:
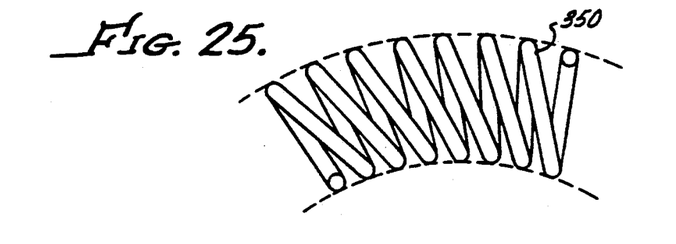
FIG. 25 is a coil spring in an unloaded or free state.
Figure 26:
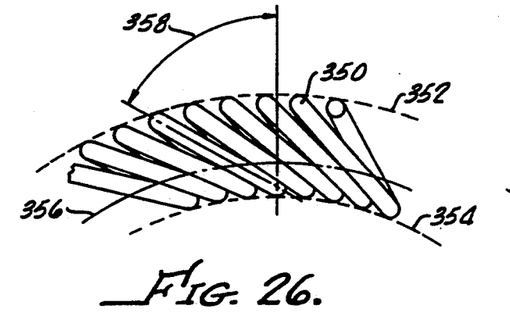
FIG. 26 shows the coil of FIG. 25 in a loaded state with spacing between the individual coils.
Figure 27:
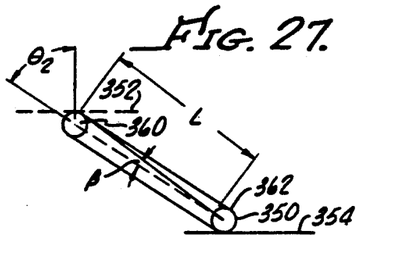
FIG. 27 is a cross-section of a single individual coil of of the loaded coil of FIG. 26 showing the maximum linear dimension or operation, L, available for electromagnetic wave propagation.

FIGS. 25–26 showing in diagrammatic form a plurality of coils in an unloaded state and loaded between surfaces along with a load circle. A final frong angle along with the maximum linear dimension, or aperture, L, available for electromagnetic wave propagation. FIG. 27 is an enlarged view of one coil showing the aperture, L, extending from a point 360 of contact on load surface 352 at the O.D. of the coil 350 to the top 362 of the coil 350 bearing on the load surface 354.

Figure 28:
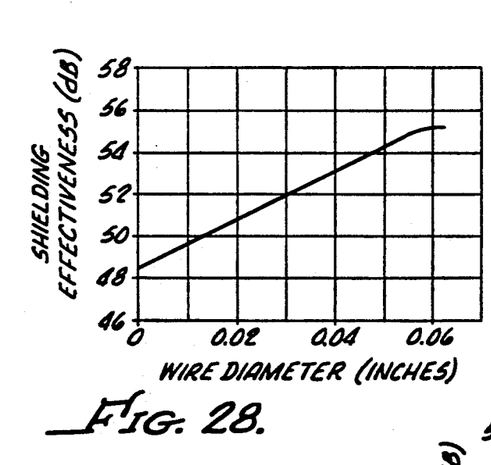
FIG. 28 shows the effect of wire diameter (d) or shield effectiveness for the coils of FIG. 26.
Figure 29:
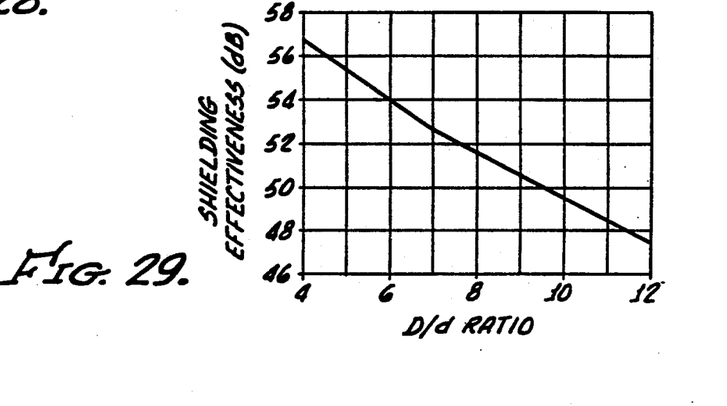
FIG. 29 shows the effect of coil height D to wire diameter (d) on the shield effectiveness for the coils of FIG. 26.

It can be determined that the aperture, L, can be made smaller and hence increase shield effectiveness for a given frequency by increasing coil wire diameter, d. This is shown in FIG. 28. Coil height D also affects the approximate size. It should be apparent that for a fixed wire diameter, d, an increase in coil height, D, decreases shield effectiveness for a given frequency. This is shown in FIG. 29. Consequently, for gaskets in accordance with the present invention in which the individual coils do not abut, the greater the wire diameter, d, and the smaller the coil height 350, D, the greater the shield effectiveness.

Figure 30:
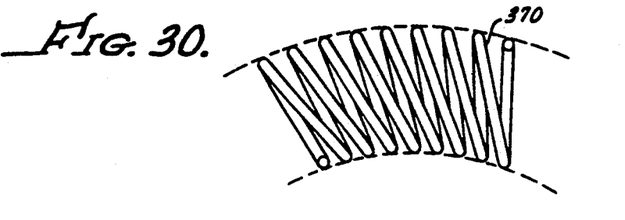
FIG. 30 is a coil spring in an unloaded or free state.
Figure 32:
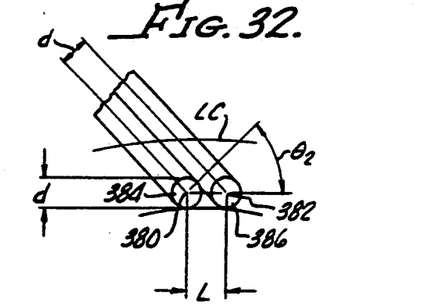
FIG. 32 is a cross-section of adjacent individual coils showing the mzximum linear dimension, L, available for electromagnetic wave propagation.

The alternative embodiment of the present invention in which coils abut is shown in FIG. 30, in a free state, and in FIG. 31, in a loaded state with adjacent coils abutting one another between surfaces. The load circle is also shown along with the final front angle. FIG. 32 is an enlarged view of the maximum linear dimension, or aperture, L, available for electromagnetic propagation.

It can be easily seen that the aperture, L, for abutting coils is significantly less than the aperture, L, in the case of spaced-apart coils shown in FIGS. 26–27. As an example, for the same wire diameter, d, and coil height, D, a gasket with coils abutting has up to four times the shielding effectiveness than coils not abutting.

Figure 33:
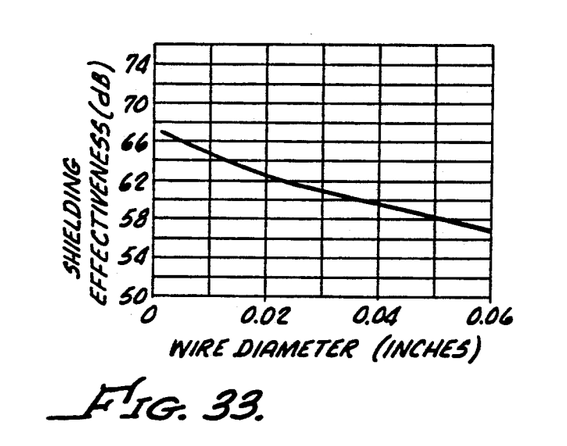
FIG. 33 shows the effect of wire diameter, D, or shield effectiveness for the coils of FIG. 31.

It is also important to note in the design of abutted coils gaskets, that because the aperture, L, extends between centers of the individual coil wires, the larger the wire diameter, the lower the shield effectiveness for a given frequency. (See FIG. 33.)

Figure 34:
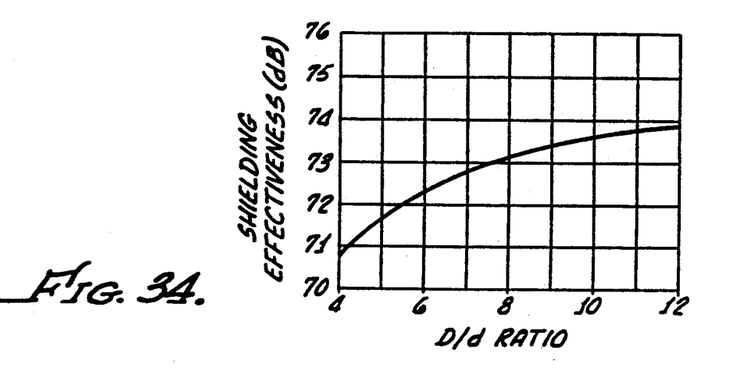
FIG. 34 shows the effect of coil height to wire diameter (d) on the shield effectiveness for the coil of FIG. 31.

The reverse is also ture for the coil heigh, D, to wire diameter ratios D/d shown in FIG. 34.

As herein described, shielding effectiveness is affected by the aperture length, L, which is determined, in part, by whether the coils 32 (FIG. 8) are spaced apart at load, or abut, as do coils (FIG. 26).

Figure 39:
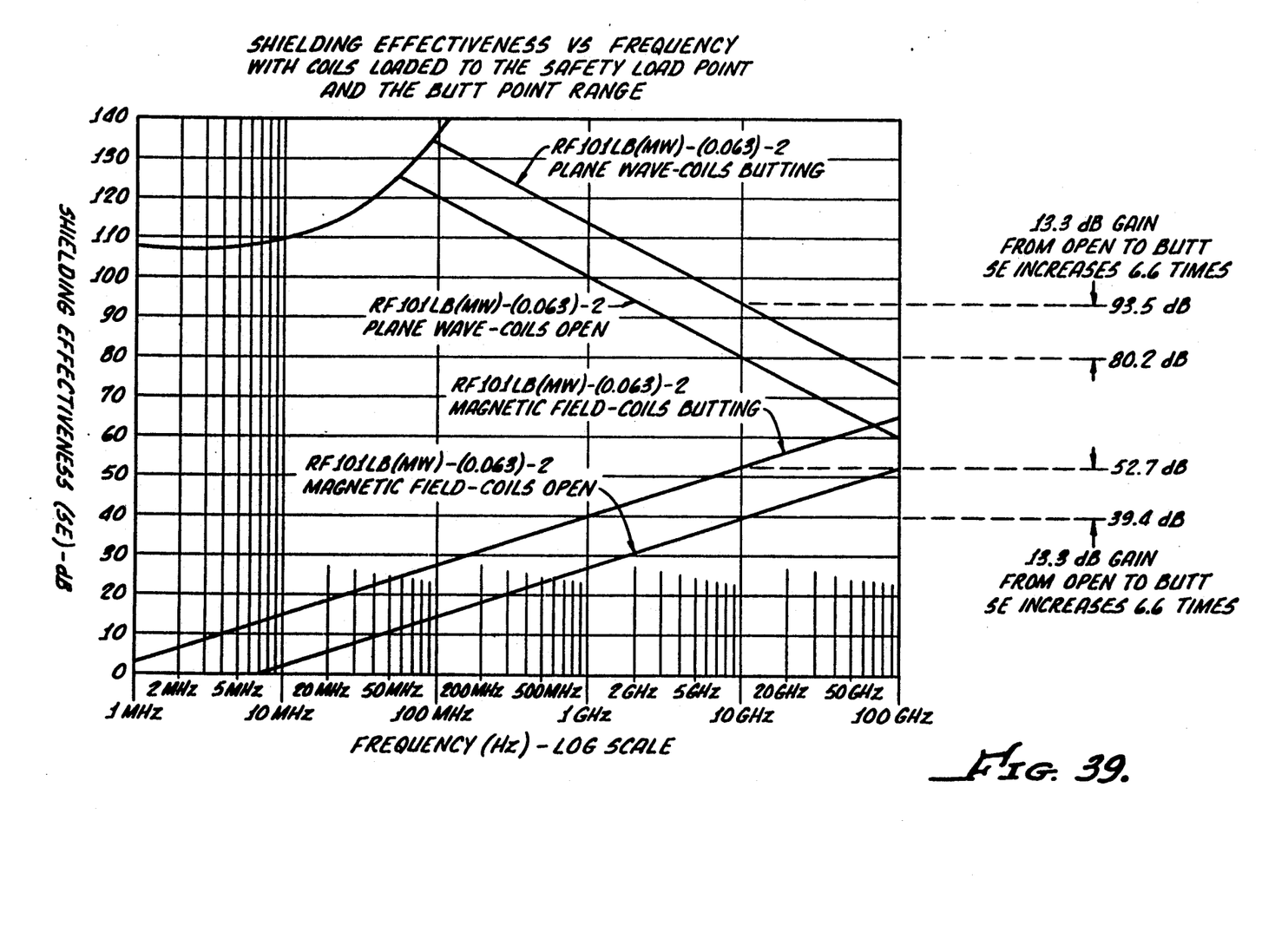
FIG. 39 is a plot of Shielding Effectiveness vs. Frequency for plane wave and magnetic fields showing the difference between abutting coils at load and non-autting coils at load for the spring gaskets of FIGS. 35-38.

A calculated comparison of the shielding efficiency of a spring 400 having the specification set forth in Table 1 with coils not abutting, see FIGS. 35-36, and coils abutting, see FIGS. 37-38 is shown in FIG. 39.

TABLE 1

SPRING PARAMETERS

| | |
|---|---|
| Wire Diameter | 0.03 inch |
| Coil Height | 0.025 inch |
| Coil Width | 0.023 inch |
| Back Angle | 12° |
| Spacing Between Coils | 0.0035 inch |
| Spring I.D. | 0.063 inch |
| Approx. # of Coils | 35 |

In FIG. 35, the spring 400 is shown in a groove 402 having a width CW and a height GH with the coils 404 having an assembled turn angle $\alpha_{AP}$ of about 70° and a load turn angle $\alpha_{LP}$ of about 45°, LC denotes the load circle with the spring 400 axially loaded. The spacing 410 between coils is more clearly shown in FIG. 36 along with the groove inside diameter 412, outside diameter 414 and load circle, LC.

FIG. 37 shows the spring 400 with the coils 404 loaded to a butting position by a wedge 420. In this case the groove 422 has an outside height, GWO, greater than an inside height, GWI. The coils 404 have an assembled turn angle $\alpha_{AP}$ of about 70° and a load turn angle $\alpha_{LP}$ of about 55°. As shown in FIG. 38, the coils abut from the groove inside diameter 412 to the load circle LC as indicated also by an arrow 430.

The average aperture for coils 404 abutting and open for various groove I.D., 412 is shown in Table 2.

TABLE 2

| | COILS | | | |
|---|---|---|---|---|
| | Butting | | Open | |
| GROOVE I.D. (Inches) | Avg. Aperture (inches) | Avg. # Coils | Avg. Aperture (inches) | Avg. # Coils |
| 0.063 | 0.0056 | 35.5 | 0.0257 | 35.5 |
| 0.125 | 0.0065 | 61.0 | 0.0264 | 61.0 |
| 0.250 | 0.0071 | 111.5 | 0.0268 | 111.5 |
| 0.500 | 0.0074 | 213.0 | 0.0271 | 213.0 |

Shielding Effectiveness vs Frequency for plane wave and magnetic field for the coils 404 abutting and not abutting as shown in FIG. 39.

As shown in FIG. 39, at a frequency of 10 GHz, with the coils 404 open at load (FIGS. 35-36) shielding effectiveness of 80.2 dB is achieved for a plane wave and for the coils (FIGS. 37-38) butting, the shielding effectiveness is 93.5 dB, with the difference between the two springs being 13.3 dB. This change, 13.3 dB corresponds to an increase in shielding effectiveness of 6.6 times greater when the coils 404 are butting at load.

For a magnetic field, the difference in shielding effectiveness is also 13.3, and, therefore, the increase in shielding effectiveness when the coils are butting versus when the coils are open is, again, 6.6 times greater.

Although there has been described hereinabove a specific electromagnetic shielding gasket in accordance with the present invention for the purpose of illustrating the manner in which the invention may be used to advantage, it should be appreciated that the invention is not limited thereto. Accordingly, any and all modifications, variations or equivalent arrangements which may occur to those skilled in the art, should be considered to be within the scope of the invention as defined in the appended claims.

What is claimed is:

1. Electromagnetic shielding spring gasket assembly comprising:

coil spring means for blocking the propagation of electromagnetic waves therepast, said coil spring means comprising:

a plurality of coils having a major and a minor axis and canted along a center line defined by an intersection of the major and minor axes, said coils being interconnected in a manner forming a radial garter-type canted-coil spring;

back angle means for both defining the disposition of a trailing portion of each coil with respect to a line normal to the center line and for determining a radial load-deflection characteristic of the canted-coil spring assembly;

front angle means for defining the disposition of a leading portion of each coil with respect to the normal line, said front angle means being greater than said back angle means; and means for noninvasively supporting the plurality of coils in an orientation for controlling the blocking of electromagnetic waves, for radial loading of the radial garter-type canted-coil spring and for controlling the resilient characteristics of the radial garter-type canted-coil spring.

2. The electromagnetic shielding spring gasket assembly according to claim 1 wherein said means for noninvasively supporting the radial garter-type canted-coil spring includes means, defining a radial groove, for deflecting the spring along a minor axis thereof and enabling said radial garter-type canted-coil spring to be radially loaded along the major axis thereof.

3. The electromagnetic shielding spring gasket assembly according to claim 1 wherein said means for noninvasively supporting the radial garter-type canted-coil spring includes means, defining a radial groove, for deflecting the spring along a major axis thereof and enabling said radial garter-type canted-coil spring to be radially loaded along the major axis thereof.

4. The electromagnetic shielding spring gasket assembly according to claim 1 wherein said means for noninvasively supporting the radial garter-type canted-coil spring includes means, defining a radial groove, for supporting and orienting said radial garter-type canted-coil spring with a turn angle of greater than zero degrees (0°) and less than ninety degrees (90°).

5. The electromagnetic shielding spring gasket assembly according to claim 2 wherein said radial garter-type canted-coil spring has an axial assembly turn angle of about 45° and about 90°, requiring turning of the spring between about 45° and about 90° in order to assemble the spring into the radial groove.

6. The electromagnetic shielding spring gasket assembly according to claim 2 wherein said radial garter-type canted-coil spring has an axial assembly turn angle of about 90°, requiring turning of the spring of about 90° in order to assemble the spring into the radial groove.

7. The electromagnetic shielding spring gasket assembly according to claim 6 wherein said radial groove has a width smaller than a width of the coils.

8. The electromagnetic shielding spring gasket assembly according to claim 6 wherein said radial groove has a depth smaller than a width of the coils.

9. The electromagnetic shielding spring gasket assembly according to claim 7 where the radial groove is greater than a height of the coils.

10. The electromagnetic shielding spring gasket assembly according to claim 2 wherein said radial groove has a width at a bottom thereof greater than a width at an opening thereof through which the spring is inserted.

11. The electromagnetic shielding gasket assembly according to claim 1 further comprising groove means for containing said coil spring means, and said means for supporting the plurality of coils includes means for causing said individual coils to abut one another without fatigue thereof and enabling repeated assembly and disassembly of parts, between which said electromagnetic shielding gasket assembly is disposed, without loss of electromagnetic shielding effectiveness due to such assembly and disassembly.

12. The electromagnetic shielding gasket assembly according to claim 11 wherein said means for causing said individual coils to abut comprises a wedge.

13. The electromagnetic shielding gasket assembly according to claim 12 wherein said wedge is an integral part of said groove means.

14. The electromagnetic shielding gasket assembly according to claim 12 wherein said wedge is disposed within said groove means and is not fixed thereto.

15. The electromagnetic shielding gasket assembly according to claim 12 wherein said individual coils are fabricated from wire having a diameter, d, selected to achieve a desired shielding effectiveness, said shielding effectiveness decreasing with increasing wire diameter.

16. The electromagnetic shielding gasket assembly according to claim 15 wherein said individual coils are formed with a coil diameter, D, selected to achieve a desired shielding effectiveness, said shielding effectiveness increasing with increasing D/d ratio.

17. The electromagnetic shielding gasket assembly according to claim 16 wherein said wedge is disposed within said groove means and including means, defining an exterior shape thereof, for loading said individual coils along a minor axis thereof.

* * * * *